United States Patent [19]
Lin et al.

[11] Patent Number: 6,149,830
[45] Date of Patent: *Nov. 21, 2000

[54] COMPOSITION AND METHOD FOR REDUCING DISHING IN PATTERNED METAL DURING CMP PROCESS

[75] Inventors: Chienting Lin, Poughkeepsie, N.Y.; Juin-Fang Wang, Hockessin, Del.; Fen Fen Jamin, Wappingers Falls; Ravikumar Ramachandran, Beacon, both of N.Y.

[73] Assignees: Siemens Aktiengesellschaft, Munich, Germany; International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/156,071

[22] Filed: Sep. 17, 1998

[51] Int. Cl.[7] .................................................. B24B 1/00
[52] U.S. Cl. .................................. 216/89; 51/307; 51/309; 438/692; 438/693
[58] Field of Search .................................. 252/29.1; 106/3; 51/307, 309; 216/89; 438/692, 693

[56] References Cited

U.S. PATENT DOCUMENTS

| | | | |
|---|---|---|---|
| 4,116,755 | 9/1978 | Coggins et al. | 156/659 |
| 4,242,842 | 1/1981 | Yancey et al. | 51/309 |
| 4,588,474 | 5/1986 | Gross | 156/659.1 |
| 4,867,757 | 9/1989 | Payne | 51/309 |
| 5,395,801 | 3/1995 | Doan et al. | 438/692 |
| 5,567,300 | 10/1996 | Datta et al. | 205/652 |
| 5,607,718 | 3/1997 | Sasaki et al. | 427/97 |
| 5,728,620 | 3/1998 | Park | 438/425 |
| 5,769,689 | 6/1998 | Cossaboon et al. | 451/41 |

OTHER PUBLICATIONS

Kumar et al., "Chemical–Mechanical Polishing of Copper in Glycerol Based Slurries", Mat. Res. Soc. Symp. Proc., vol. 427, pp. 237–242 (1996). No Month.

Nogo et al., "Slurry Engineering for Self–Stopping, Dishing Free SiO2–CMP", IEDM, pp. 349–352, ©1996 IEEE. No Month.

*Primary Examiner*—C. Melissa Koslow
*Attorney, Agent, or Firm*—Stanton C. Braden

[57] ABSTRACT

A composition for reducing dishing in patterned large metal surfaces embedded in a dielectric as a workpiece during chemical mechanical polishing, comprising: a viscosity increasing amount of viscosity enhancer in replacement of a portion of deionized water in a slurry containing an abrasive.

6 Claims, 3 Drawing Sheets

COMPOSITION AND METHOD FOR REDUCING DISHING IN PATTERNED METAL DURING CMP PROCESS

FIELD OF THE INVENTION

The invention relates to the use of a viscosity modifier in replacement of a portion of deionized water to significantly reduce dishing of large metal surfaces that are embedded in a pattern along with small metal surfaces in a dielectric during CMP (chemical mechanical polishing).

In general, the planarization of large metal surfaces that are part of a pattern along with small metal surfaces during CMP processes on metal patterns embedded in a dielectric, such as a silicon dioxide wafer, is accomplished by increasing the viscosity of the polishing slurry by adding a viscosity modifier in amounts between about 0.1–50 volume percent, in order to obtain significantly less dishing than would be the case when using deionized water alone and abrasive particles, oxidizers, and other chemicals including dispersants and surfactants.

DESCRIPTION OF THE PRIOR ART

During chemical-mechanical polishing (CMP) of materials such as interlayer dielectrics used in the manufacture of integrated circuits and other electronic devices, a slurry is generally used in conjunction with a polishing pad to facilitate the removal of an insulator, dielectric, or metal pattern material. In many of these CMP applications, the insulating or dielectric material is $SiO_2$, and in an aqueous environment the surface undergoes a hydration reaction with $H_2O$ to produce a surface network of hydroxylated Si molecules.

However, when the metal is a large surface that is part of a patterned metal design embedded in a dielectric on which other layers and a substrate are attached, the use of a CMP process to polish the patterned metal creates a severe amount of dishing in the larger metal features.

U.S. Pat. No. 5,769,689 discloses compositions for a method of polishing a workpiece comprised of silicon dioxide wherein the surface of the workpiece is exposed to a polishing composition comprising water, submicron $SiO_2$ particles, a soluble inorganic salt at a concentration below the critical coagulation concentration for the composition, and the pH of the composition is adjusted to within a range of about 9–10 by the addition of a soluble amine.

Kumar et al., "CHEMICAL-MECHANICAL POLISHING OF COPPER IN GLYCEROL BASED SLURRIES", Mat. Res. Soc. Symp. Proc. Vol. 427, pps 237–242 (1996), discloses the use of a slurry containing glycerol and $Al_2O_3$ abrasive for CMP processing of a copper metal surface to render the copper suitable as an interconnect fabrication. The process is an alternative to reactive ion etching of copper.

A chemical-mechanical polishing technique for LSI's to address the problem of dishing is disclosed in U.S. Pat. No. 5,607,718, in which a number of compounds are added to decrease the solution velocity and suppress dishing. These compounds include a number of thickeners such as silicates, glucose, tragacanth gum and agar.

Nogo et al., "SLURRY ENGINEERING FOR SELF-STOPPING, DISHING FREE $SiO_2$—CMP", IEDM, pages 349–352, ©1996 IEEE, discloses a slurry in which a surfactant was added to a conventional $CeO_2$ slurry for $SiO_2$ in chemical mechanical polishing (CMP) to obtain global planarization within a chip without any stopgoing layer or design limitations.

U.S. Pat. No. 4,588,474 discloses a cleaning treatment on a metal surface wherein glycerin is added to the solution along with other additives to obtain a smoother and more uniform surface. These solutions contain a caustic, a nitrate or nitrite, and optionally, a diol or polyol such as ethylene glycol or glycerin, and the workpiece is an aluminum alloy.

An electrochemical polishing technique for metal removal and planarization of various components in various stages of microelectronic fabrication is disclosed in U.S. Pat. No. 5,567,300. This patent is directed to feature removal, and uses a non-viscous polyol to enhance removal. Glycerin, which has a viscosity at room temperature of 1500 times that of water, is used in electroetching to increase the electrolyte viscosity and promote polishing.

A significant disadvantage of the processes in the foregoing patent and literature references is that, there is no acknowledgement of the need to modify the slurries used in CMP by a viscosity modifier to enable prevention of severe dishing in larger metal features of a patterned metal embedded in a dielectric onto which other layers and a substrate are attached, when subjecting this workpiece to chemical mechanical polishing.

SUMMARY OF THE INVENTION

One object of the present invention is to provide a composition or slurry capable of preventing severe dishing of large metal surfaces embedded along with small metal surfaces in a dielectric, when the workpiece containing these metal features in the dielectric is subjected to chemical mechanical polishing (CMP).

Another object of the present invention is to provide modification of the viscosity of a composition or slurry used in chemical mechanical polishing by replacement of a portion of deionized water in the slurry with a viscosity modifier that will provide significant reduction of severe dishing of large metal surfaces embedded in a pattern along with small metal surfaces in a dielectric, when the workpiece containing these metal features in the dielectric is subjected to CMP.

A yet further object of the present invention is to provide a slurry that is improved by the addition of a viscosity modifier added in amounts from 0.1 to 50 volume percent, to significantly impede severe dishing of large metal surfaces embedded in a pattern along with small metal surfaces in a dielectric, when the workpiece containing the metal features in the dielectric is subjected to CMP.

In general, the invention is accomplished by providing a deionized composition in which a portion of the deionized water is replaced with from about 0.1–50 volume percent of a viscosity modifier, and utilizing the viscosity modified slurry along with a suitable abrasive to polish a workpiece containing large metal surfaces embedded along with small metal surfaces in a pattern in a dielectric, and thereby prevent severe dishing of large metal surfaces during CMP.

The composition for reducing dishing in patterned large metal surfaces embedded along with small metal surfaces in a dielectric as a workpiece during chemical polishing, consist essentially of: a viscosity increasing amount of a viscosity enhancer that is non-reactive, polyhydric alcohol selected from glycerol or polyethylene glycol, in replacement of a portion of deionized water in a slurry containing an abrasive; wherein the viscosity enhancer is present in amounts up to 50 volume percent of deionized water, and the composition is characterized by a viscosity from between 3.4 to 12 cps.

The method for reducing dishing in patterned large metal surfaces embedded along with small metal surfaces in a dielectric as a workpiece during chemical mechanical polishing, comprises: exposing the surface of the workpiece to a polishing composition comprising a viscosity increasing amount of a viscosity enhancer that is a non-reactive polyhydric alcohol selected from glycerol or polyethylene glycol, in replacement of a portion of deionized water in a slurry containing an abrasive, wherein said viscosity enhancer is present in amounts up to 50 volume percent of deionized water; and the composition has a viscosity of between 3.4 to 12 cps.

DETAILED DESCRIPTION OF THE INVENTION

The foregoing and other objects and advantages of the invention will be better understood by resort to the following detailed description of the preferred embodiments of the invention.

In order to protect the metal features or lines from excessive dishing in chemical-mechanical polishing without the addition of dummy structures or hard mask, the invention process introduces a viscosity enhancer or modifier into the slurry. The slurry viscosity can be increased by the addition of any viscosity enhancer or modifier; however, in the context of the invention, preferred enhancers or modifiers are non-reactive, polyhydric alcohol containing materials. Most preferred are glycerol and polyethylene glycol. The glycerol or polyethylene glycol replaces a portion of the deionized water in the aqueous-based slurry up to an amount of about 50% by volume. The introduced high viscosity brought about by the enhancer limits the momentum and/or mass transfer of slurry abrasives and reactants/products of chemical reactions, and subsequently slows down the removal rate of the recessed metal features or lines of the microelectronic device.

The improvement of lessened dishing is most readily observed in the large metal features of the metal pattern in the work piece containing the metal features in the dielectric where dishing is usually easily observed.

Although not wishing to the bound by a theory as to how prevention of severe dishing is accomplished, it is nevertheless believed that the use of a non-reactive, polyhydric alcohol to replace a portion of deionized water in the aqueous-based slurry induces a limiting effect of the material removal from the large metal surface area and eventually renders a desired and minimum large metal pad dishing after CMP processes as a result of the introduction of the viscosity enhancer into the slurry.

EXAMPLE

A CVD tungsten film was used as the patterned metal surface in a $SiO_2$ dielectric in the form of a wafer.

The polishing slurry consisted of 5 weight percent alumina abrasive, an oxidizer and varying concentrations of glycerol ranging from about 0.1 to about 50% by volume of the deionized water. The solution was mixed to homogeneity prior to polishing in order to ensure that there was not settling of these slurry particles.

TABLE I shows a comparison of the slurry viscosity based upon the percent by volume of glycerol replacing deionized water.

TABLE I

| Volume % Glycerol | Slurry Viscosity (cps) |
| --- | --- |
| 0 | 3.4 |
| 25 | 5.7 |
| 50 | 12 |

The primary abrasive sizes of alumina range from between about 0.01 $\mu$m to about 0.3 $\mu$m, and about 100 ml of slurry is delivered to the polishing pad prior to the beginning of polishing and then delivered at a rate of up to about 350 ml/min during the polishing step.

Figure 1:
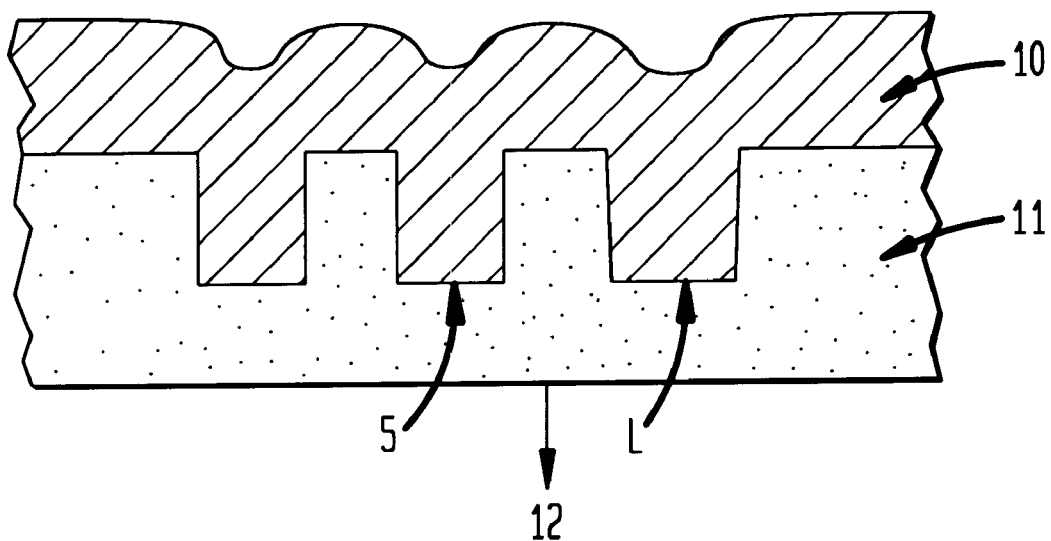
FIG. 1 is a cross-sectional view of a workpiece depicting a pattern of large and small metal surfaces embedded in a dielectric, and wherein other layers and substrate are attached to the dielectric, prior to CMP.

FIG. 1, shows a cross-sectional view of a workpiece depicting a metal 10 having a pattern of large L and small S metal surfaces embedded in a dielectric 11, and wherein other layers and a substrate designed by arrow 12 are attached, prior to chemical-mechanical polishing (CMP).

Figure 2:
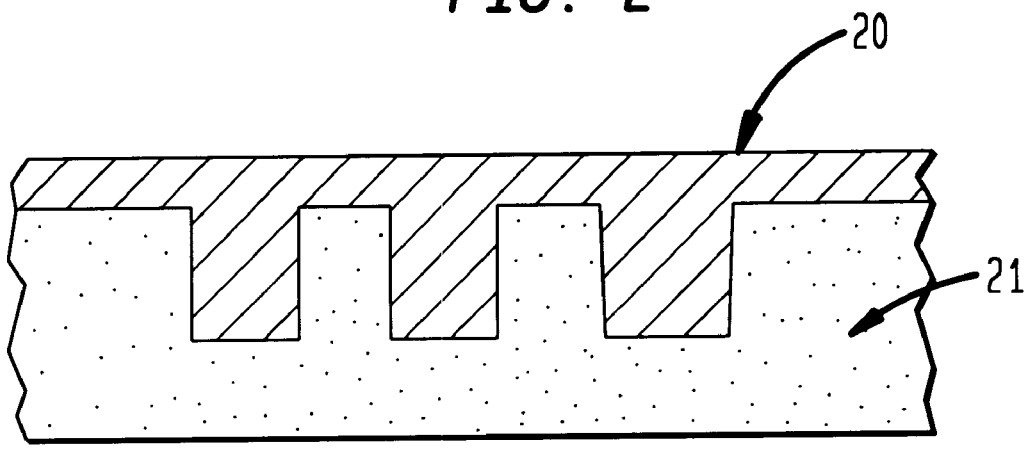
FIG. 2 is a cross-sectional view of a workpiece that has progressed half way through chemical-mechanical polishing, with part of the metal surface removed.

As may be seen from the cross-sectional view of FIG. 2, part of the metal surface 10 is removed to surface 20 half way through the chemical-mechanical polishing step, and the dielectric 21 remains substantially unaltered.

Figure 3:
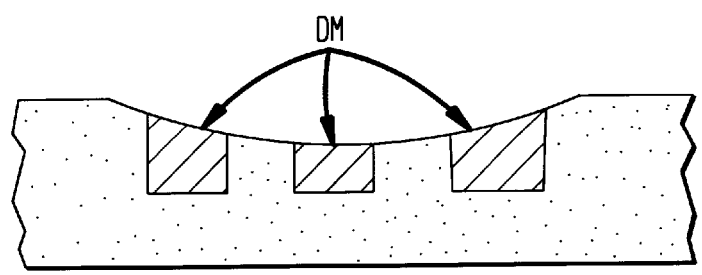
FIG. 3 is a cross-sectional view of a workpiece showing completion of CMP, wherein blanket metal has been removed, and the metal remains only in patterns.

From the enlarged cross-sectional view of FIG. 3, which shows completion of the CMP step, the blanket metal has been removed, and only the large and small patterned metals PM remain in the dielectric.

Figure 4:
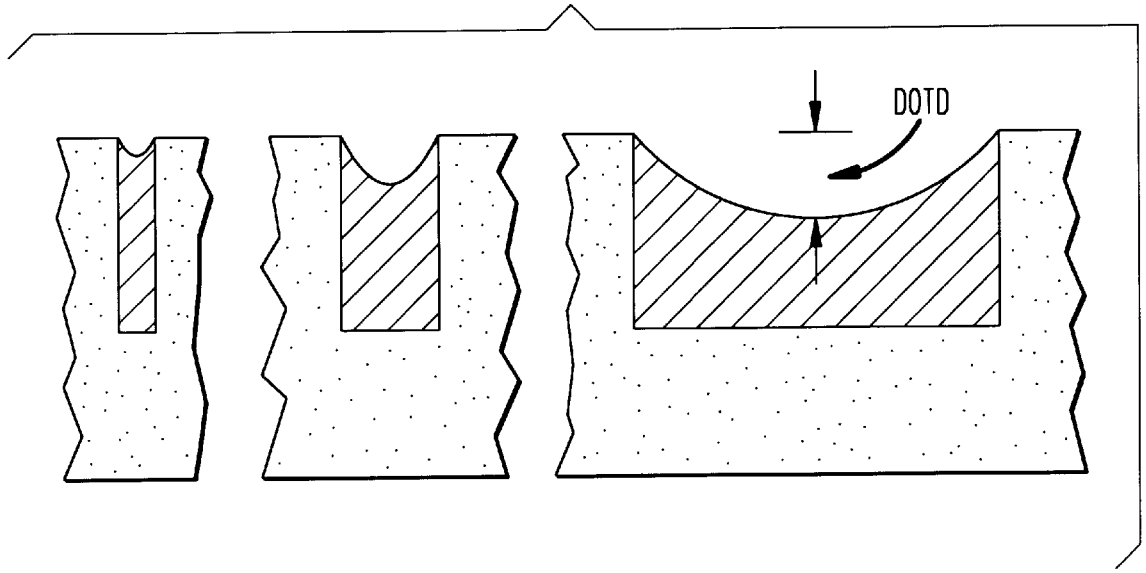
FIG. 4 is an enlarged cross-sectional view of the workpiece of FIG. 3 showing the larger metal features characterized by more severe dishing as a result of prior art CMP.

However, from the more enlarged cross-sectional view of FIG. 4, it is clearly seen that the larger metal feature or pattern has undergone more severe dishing D, as a result of the prior art of CMP step.

Figure 5:
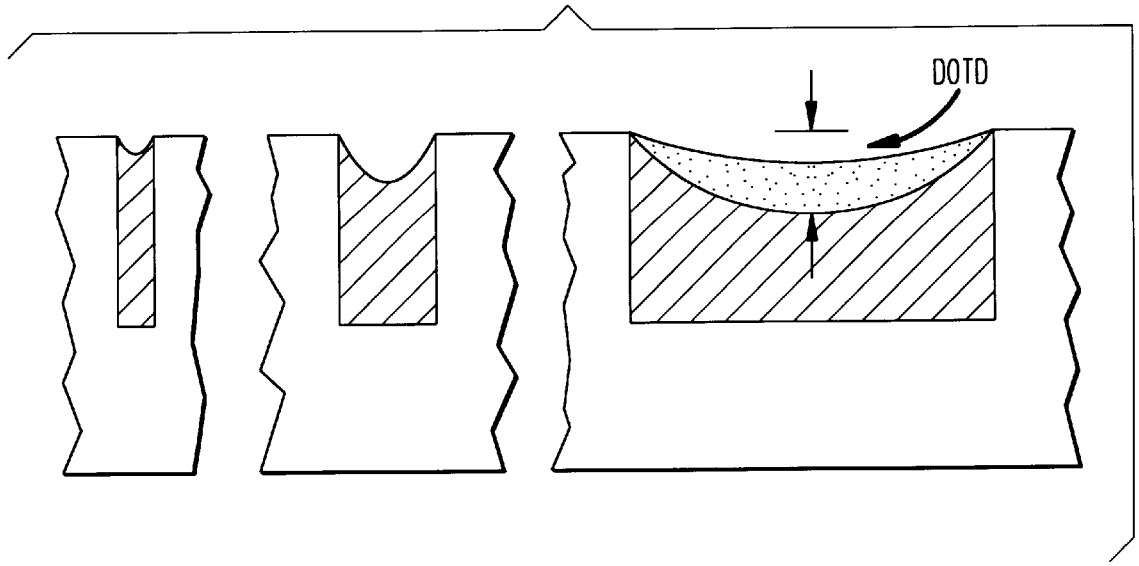
FIG. 5 is an enlarged cross-sectional view of a workpiece showing larger metal features not characterized by severe dishing as a result of subjecting the workpiece to a slurry containing from 0.1 to 50 volume percent of glycerol as a viscosity modifier in replacement of a portion of deionized water.

As a result of the use of the viscosity enhanced slurry of the present invention, in which, from about 0.1 to about 50 volume percent of glycerol has been used in replacement of a portion of deionized water as a viscosity enhancer, the depth of the dishing DOTD in the large metal features shown in FIG. 5 has been substantially lessened by approximately two-thirds at the conclusion of the CMP step. The dotted area represents the extent of the improvement.

Figure 6:
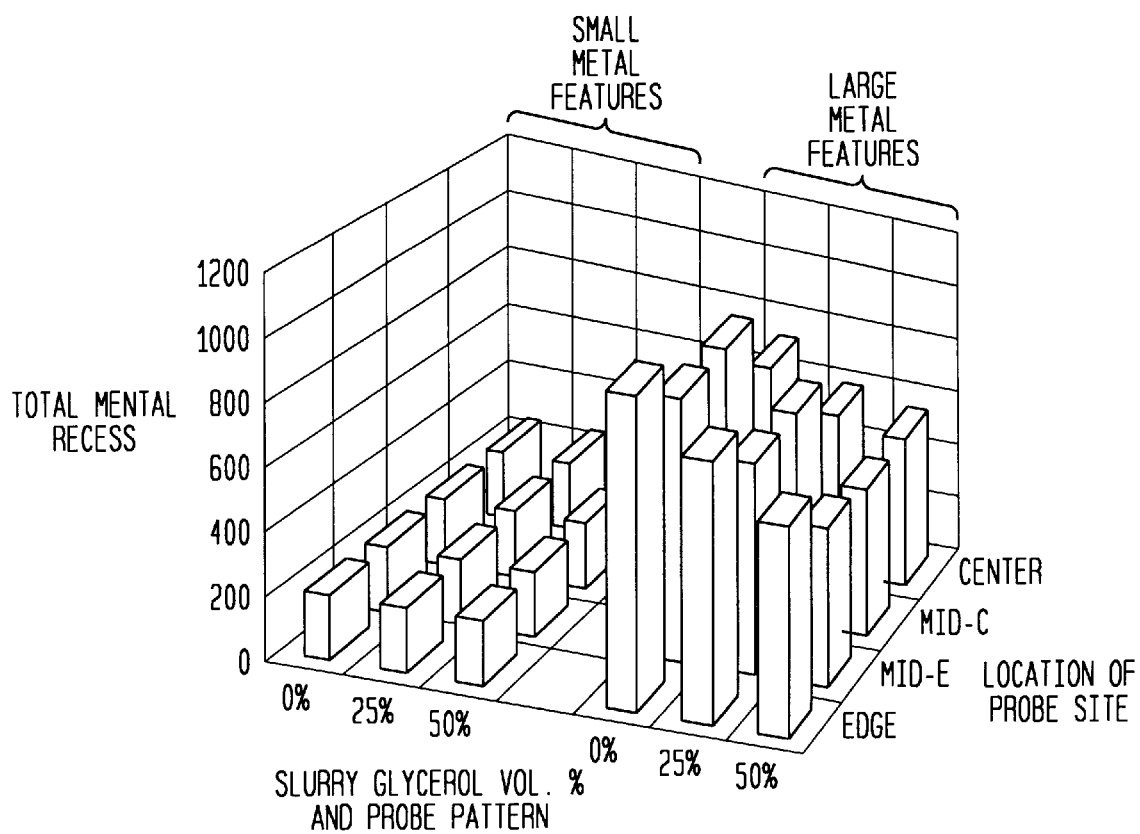
FIG. 6 is a graph showing metal pad and line recess at various locations of wafers or workpieces having a pattern of large and small metal surfaces embedded in a $SiO_2$ dielectric subjected to CMP using the invention slurry containing from 0.1 to 50% by volume of glycerol in replacement of deionized water.

The metal lost profile as a function of percent glycerol, probe pattern, and location of probe site are depicted in FIG. 6, which shows metal pad and line recess (dishing) as a result of using the glycerol volume percents of the invention on a wafer in the CMP step.

Additional advantages and modifications will readily occur to those skilled in the art. Accordingly, the invention in its broader aspects is not limited to the specific details and illustrated examples shown and described herein. Therefore, various modifications may be made without departing from the spirit or scope of the general inventive concept as defined by the appended claims and their equivalents.

What is claimed is:

1. A composition for reducing dishing in patterned large metal surfaces embedded along with small metal surfaces in a dielectric as a workpiece during chemical mechanical polishing, consisting essentially of: a viscosity increasing amount of a viscosity enhancer that is a non-reactive, polyhydric alcohol selected from glycerol or polyethylene glycol, in replacement of a portion of deionized water in a slurry containing an abrasive; wherein said viscosity enhancer is present in amounts up to 50 volume percent of deionized water, and said composition is characterized by a viscosity from between 3.4 to 12 cps.

2. The composition of claim 1 wherein said viscosity enhancer is glycerol.

3. The composition of claim 2 wherein said abrasive is alumina.

4. A method for reducing dishing in patterned large metal surfaces embedded along with small metal surfaces in a dielectric as a workpiece during chemical mechanical polishing, comprising: exposing the surface of said workpiece to a polishing composition comprising a viscosity increasing amount of a viscosity enhancer that is a non-reactive polyhydric alcohol selected from glycerol or polyethylene glycol, in replacement of a portion of deionized water in a slurry containing an abrasive, wherein said viscosity enhancer is present in amounts up to 50 volume percent of deionized water; said slurry having a viscosity of between 3.4 to 12 cps.

5. The method of claim 4 wherein said viscosity enhancer is glycerol.

6. The method of claim 5 wherein said abrasive is alumina.

* * * * *

UNITED STATES PATENT AND TRADEMARK OFFICE
CERTIFICATE OF CORRECTION

PATENT NO. : 6,149,830
DATED : November 21, 2000
INVENTOR(S) : Lee et al.

It is certified that error appears in the above-identified patent and that said Letters Patent is hereby corrected as shown below:

On title page,

Inventors:

Line 75: following "Inventors:" correct the spelling of inventors name -- Chenting Lin--.

Signed and Sealed this

Twenty-ninth Day of May, 2001

*Attest:*

NICHOLAS P. GODICI

*Attesting Officer*      *Acting Director of the United States Patent and Trademark Office*